United States Patent
Oh et al.

(10) Patent No.: US 9,835,781 B2
(45) Date of Patent: Dec. 5, 2017

(54) WIRE GRID POLARIZER AND METHOD OF FABRICATING THE SAME

(71) Applicant: SAMSUNG DISPLAY CO., LTD., Yongin, Gyeonggi-Do (KR)

(72) Inventors: Ji Hoon Oh, Daegu (KR); Tae Young Ahn, Suwon-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 64 days.

(21) Appl. No.: 14/877,736

(22) Filed: Oct. 7, 2015

(65) Prior Publication Data

US 2016/0299273 A1    Oct. 13, 2016

(30) Foreign Application Priority Data

Apr. 8, 2015  (KR) ........................ 10-2015-0049381

(51) Int. Cl.
  *G02B 5/30* (2006.01)
  *H01L 21/033* (2006.01)
  *H01L 21/3213* (2006.01)

(52) U.S. Cl.
  CPC ........ *G02B 5/3058* (2013.01); *H01L 21/0332* (2013.01); *H01L 21/32139* (2013.01)

(58) Field of Classification Search
  None
  See application file for complete search history.

(56) References Cited

U.S. PATENT DOCUMENTS

| | | |
|---|---|---|
| 6,156,485 A | 12/2000 | Tang et al. |
| 2006/0124587 A1 | 6/2006 | Lee |
| 2008/0100779 A1 | 5/2008 | Choo et al. |
| 2010/0214695 A1 | 8/2010 | Isowaki et al. |
| 2014/0016059 A1 | 1/2014 | Lee et al. |
| 2014/0028956 A1 | 1/2014 | Choi et al. |
| 2014/0057442 A1 | 2/2014 | Lee et al. |
| 2015/0002791 A1* | 1/2015 | Nam .................... G02B 5/3058 349/96 |
| 2015/0060396 A1 | 3/2015 | Kaida et al. |
| 2016/0033701 A1* | 2/2016 | Yang .................... G02B 5/3058 359/485.05 |

FOREIGN PATENT DOCUMENTS

| | | |
|---|---|---|
| JP | 2012-256055 | 12/2012 |
| KR | 1020110113968 | 10/2011 |
| KR | 1020130024041 | 3/2013 |
| KR | 1020130126391 | 11/2013 |

OTHER PUBLICATIONS

European Search Report dated Aug. 5, 2016 by the EPO in European Patent Application No. 16154005.9, filed Feb. 3, 2016.

* cited by examiner

*Primary Examiner* — Derek S Chapel
(74) *Attorney, Agent, or Firm* — F. Chau & Associates, LLC

(57) ABSTRACT

Provided is a wire grid polarizer comprising a substrate, a plurality of conductive wire patterns formed in parallel to protrude from a top surface of the substrate and first hard mask patterns disposed on the conductive wire patterns and second hard mask patterns disposed on the first hard mask patterns, wherein a ratio of a taper angle of the second hard mask patterns to a taper angle of the first hard mask pattern is 1 or greater.

15 Claims, 12 Drawing Sheets

WIRE GRID POLARIZER AND METHOD OF FABRICATING THE SAME

This application claims priority from, and the benefit of, Korean Patent Application No. 10-2015-0049381 filed on Apr. 8, 2015 in the Korean Intellectual Property Office, the contents of which are herein incorporated by reference in their entirety.

BACKGROUND

1. Technical Field

Embodiments of the present disclosure are directed to a wire grid polarizer and a method of fabricating the same.

2. Discussion of the Related Art

A wire grid polarizer is a parallel conduction wire array in which conductor wires are arranged in parallel to polarize certain light from electromagnetic waves.

In response to non-polarized incident light, a wire grid polarizer with a smaller period than the wavelength of the incident light reflects polarized light in a direction parallel to the wires thereof, and transmits therethrough polarized light in a direction perpendicular to the wires thereof. A wire grid polarizer, unlike an absorptive polarizer, allows reflected polarized light to be reused.

SUMMARY

Exemplary embodiments of the disclosure provide a wire grid polarizer with excellent processability, a display device including the wire grid polarizer, and a method of fabricating the wire grid polarizer.

According to an exemplary embodiment of the disclosure, a wire grid polarizer includes a substrate, a plurality of conductive wire patterns formed in parallel that protrude from a top surface of the substrate, first hard mask patterns disposed on the conductive wire patterns, and second hard mask patterns disposed on the first hard mask patterns, wherein a ratio of a taper angle of the second hard mask patterns to a taper angle of the first hard mask pattern is about 1 or greater.

The taper angle of the first hard mask patterns may be about 90 degrees or less.

The taper angle of the second hard mask patterns may be about 90 degrees or greater.

A ratio of a bottom width of the second hard mask patterns to a top width of the first hard mask patterns may be about 1 or less.

A thickness of the first hard mask patterns may be in a range of about 10 nm to about 30 nm.

The wire grid polarizer may further include a protective layer disposed spaced from the substrate that overlaps an entire surface of the substrate where the conductive wire patterns are formed.

The wire grid polarizer may further include reflective layers disposed on the substrate among the conductive wire patterns, wherein first hard mask patterns are disposed on the reflective layers.

According to another exemplary embodiment of the disclosure, a wire grid polarizer includes a substrate, a plurality of conductive wire patterns formed in parallel that protrude from a top surface of the substrate, first hard mask patterns disposed on the conductive wire patterns, and second hard mask patterns disposed on the first hard mask patterns, wherein a ratio of a bottom width of the second hard mask patterns to a top width of the first hard mask patterns is about 1 or less.

A ratio of a taper angle of the second hard mask patterns to a taper angle of the first hard mask pattern may be about 1 or greater, and the taper angle of the first hard mask patterns may be about 90 degrees or less.

A ratio of a taper angle of the second hard mask patterns to a taper angle of the first hard mask pattern may be about 1 or greater and the taper angle of the second hard mask patterns may be about 90 degrees or greater.

The taper angle of the first hard mask patterns may be about 90 degrees or less.

The taper angle of the second hard mask patterns may be about 90 degrees or greater.

A thickness of the first hard mask patterns may be in a range of about 10 nm to about 30 nm.

The wire grid polarizer according to another exemplary embodiment may further include a protective layer disposed spaced from the substrate that overlap a an entire surface of the substrate where the conductive wire patterns are formed.

The wire grid polarizer according to another exemplary embodiment may further include reflective layers disposed on the substrate among the conductive wire patterns, wherein first hard mask patterns are disposed on the reflective layers.

A method of fabricating a wire polarizer includes sequentially depositing a conductive wire patternless layer and a first hard mask layer on a substrate, forming resist patterns on the first hard mask layer, forming second hard mask patterns among the resist patterns, removing the resist patterns, patterning the first hard mask layer using the second hard mask patterns and patterning the conductive wire patternless layer using the first hard mask patterns and the second hard mask patterns.

The method of fabricating may further include, before forming the second hard mask patterns, performing a selective hydrophobic treatment process on surfaces of the resist patterns.

Patterning the conductive wire patternless layer may include forming conductive wire patterns.

The method of fabricating may further include, after patterning the conductive wire patternless layer, forming a protective layer on the second hard mask patterns, wherein the protective layer is spaced from the substrate and overlaps an entire surface of the substrate.

Patterning the conductive wire patternless layer may include forming conductive wire patterns and reflective layers.

Forming the resist patterns may include using a roll resist method.

According to the exemplary embodiments, it is possible to provide a wire grid polarizer with excellent processability.

However, exemplary embodiments of the disclosure are not restricted to those set forth herein. The above and other exemplary embodiments of the disclosure will become more apparent to one of ordinary skill in the art to which the disclosure pertains by referencing the detailed description of the disclosure given below, the drawings, and the claims.

DETAILED DESCRIPTION OF EXEMPLARY EMBODIMENTS

Figure 1:
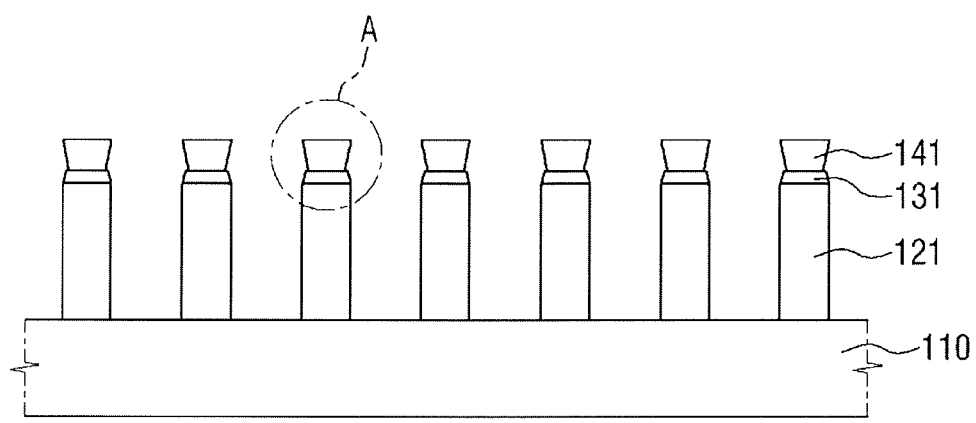
FIG. 1 is a vertical cross-sectional view of a wire grid polarizer according to an exemplary embodiment of the disclosure.

Features of the inventive concept and methods of accomplishing the same may be understood more readily by reference to the following detailed description of exemplary embodiments and the accompanying drawings. Embodiments of the inventive concept may, however, take many different forms and should not be construed as being limited to the embodiments set forth herein.

In the drawings, the thickness of layers and regions may be exaggerated for clarity. It will be understood that when an element or layer is referred to as being "on," "connected to" or "coupled to" another element or layer, the element or layer can be directly on, connected or coupled to another element or layer or intervening elements or layers. As used herein, connected may refer to elements being physically, electrically and/or fluidly connected to each other. Like numbers may refer to like elements throughout.

Herein, when one value is described as being about equal to another value, it is to be understood that the values are equal to each other to within a measurement error, or if measurably unequal, are close enough in value to be functionally equal to each other as would be understood by a person having ordinary skill in the art.

Exemplary embodiments will hereinafter be described with reference to the accompanying drawings.

Figure 2:
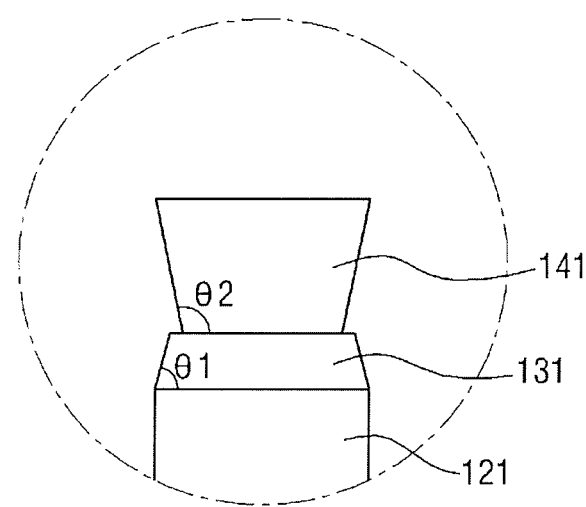
FIG. 2 is a partial enlarged view of area A in FIG. 1.

FIG. 1 is a vertical cross-sectional view of a wire grid polarizer according to an exemplary embodiment of the disclosure, and FIG. 2 is a partial enlarged view of area A in FIG. 1.

Referring to FIGS. 1 and 2, the wire grid polarizer may include a substrate 110, a plurality of conductive wire patterns 121 formed in parallel to protrude from a top surface of the substrate 110, a plurality of first hard mask patterns 131 disposed on the conductive wire patterns 121, and a plurality of second hard mask patterns 141 disposed on the first hard mask patterns 131.

The material of the substrate 110 transmits visible light therethrough, and may otherwise be appropriately selected in consideration of the purpose of use of the substrate 110 and the type of processing to which the substrate 110 is to be subjected. For example, the substrate 110 may be formed of various polymers such as glass, quartz, acrylic, triacetyl cellulose (TAC), a cyclic olefin copolymer (COP), a cyclic olefin polymer (COC), polycarbonate (PC), polyethylene terephthalate (PET), or polyethersulfone (PES), but the disclosure is not limited thereto. The substrate 110 may be formed of a flexible optical film material.

The conductive wire patterns 121 may be arranged in a predetermined period. When the period of the conductive wire patterns 121 is shorter than the wavelength of incident light, the polarization extinction ratio of the wire grid polarizer increases. However, the shorter the period, the more challenging it becomes to fabricate the wire grid polarizer. A visible light spectrum generally ranges from about 380 to about 780 nm. A wire grid polarizer should have a period of at least 200 nm or less to have a high extinction ratio for the three primary colors, i.e., red, green and blue, of light. Only then can polarization characteristics be expected. The wire grid polarizer may have, but is not limited to, a period of about 120 nm or less to exhibit polarization performance equal to or better than that of a related-art polarizer.

The conductive wire patterns 121 may be formed of any conductive material. In an exemplary embodiment, the conductive wire patterns 121 may be formed of a metal. More specifically, the conductive wire patterns 121 may be formed of a metal selected from the group consisting essentially of aluminum (Al), chromium (Cr), gold (Au), silver (Ag), copper (Cu), nickel (Ni), iron (Fe), tungsten (W), cobalt (Co) and molybdenum (Mo), or an alloy of the metal, but the disclosure is not limited thereto.

The conductive wire patterns 121 may include two or more layers. For example, the conductive wire patterns 121 may include first conductive wire patterns, which are formed of aluminum (Al), and second conductive wire patterns, which are formed of titanium (Ti) or molybdenum (Mo), but embodiments of the disclosure are not limited thereto. If the first conductive wire patterns 121 are formed of Al, hillocks may be generated at the top of the first conductive wire patterns in a subsequent process, depending on the temperature. As a result, the top surface of the wire grid polarizer may become irregular, and optical properties of the wire grid polarizer may deteriorate. To address this situation, the second conductive wire patterns are formed on the first conductive wire patterns using Ti or Mo to prevent the generation of hillocks.

The width of the conductive wire patterns 121 may be in, but is not limited to, the range of about 10 nm to about 500 nm, or the range of about 10 nm to about 200 nm, as long as it is less than the period of the conductive wire patterns 121 and the conductive wire patterns 121 can exhibit polarization.

The first hard mask patterns 131 are formed on the conductive wire patterns 121. The thickness of the first hard mask patterns 131 may be in, but is not limited to, the range of about 10 nm to about 30 nm to prevent the taper angle of the first hard mask patterns 131 from becoming too small during etching.

The first hard mask patterns 131 may be formed of a transparent material, such as a polymer, an oxide or a nitride. For example, the first hard mask patterns 131 may be formed of silicon oxide (SiOx), silicon nitride (SiNx), silicon oxycarbide (SiOC) or a mixture thereof, but embodiments of the disclosure are not limited thereto.

The second hard mask patterns 141 is formed on the first hard mask patterns 131. The thickness of the second hard mask patterns 141 is not particularly limited.

The second hard mask patterns 141 may be formed of a transparent material, such as a polymer, an oxide or a nitride. For example, the second hard mask patterns 141 may be formed of SiOx, SiNx, SiOC or a mixture thereof, but embodiments of the disclosure are not limited thereto. The second hard mask patterns 141 may be formed of the same material as the first hard mask patterns 131, but embodiments of the disclosure are not limited thereto.

The ratio of a taper angle θ2 of the second hard mask patterns 141 to a taper angle θ1 of the first hard mask patterns 131, i.e., θ2/θ1, may be about 1 or greater. For example, the taper angle θ1 of the first hard mask patterns 131 may be in, but is not limited to, the range of about 90 degrees or less, and the taper angle θ2 of the second hard mask patterns 141 may be in, but is not limited to, the range of about 90 degrees or greater.

In an exemplary embodiment, the top width of the first hard mask patterns 131 may be greater than, or equal to, the bottom width of the second hard mask patterns 141, so that a ratio of the bottom width of the second hard mask patterns to the top width of the first hard mask patterns is about 1 or less, but embodiments of the disclosure are not limited thereto.

Figure 3:
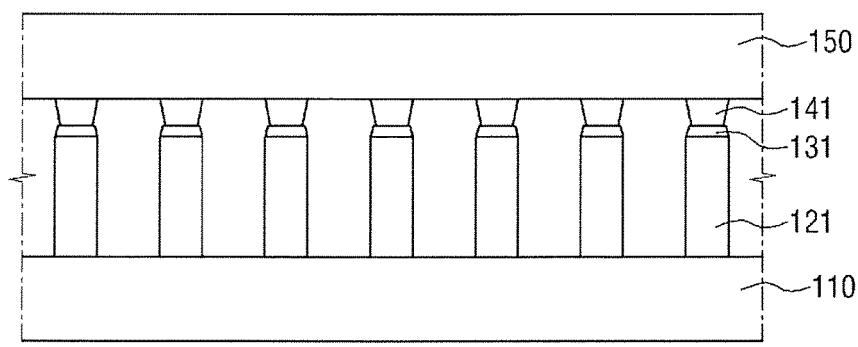
FIG. 3 is a vertical cross-sectional view of a wire grid polarizer according to another exemplary embodiment of the disclosure.

FIG. 3 is a vertical cross-sectional view of a wire grid polarizer according to another exemplary embodiment of the disclosure.

The wire grid polarizer shown in FIG. 3 has a structure similar to that of the wire grid polarizer of FIG. 1 except that it further includes a protective layer 150 spaced from the substrate 110 that overlaps an entire surface of the substrate 110 on which a plurality of conductive wire patterns 121 are formed.

The protective layer 150 may non-conductively treat the top surface of the wire grid polarizer, planarize the surface of the wire grid polarizer and secure spaces between the conductive wire patterns 121. The protective layer 150 may be formed of any non-conductive transparent material.

For example, the protective layer 150 may be formed of one selected from the group consisting essentially of, for example, SiOx, SiNx and SiOC. For example, the protective layer 150 may have a structure that includes a SiOx layer and a SiOC layer deposited on the SiOx layer. In this example, the protective layer 150 can be deposited using the same chamber and the same conditions by changing raw material gases, and can be efficiently formed because the SiOC layer can be relatively quickly deposited.

Other elements of the wire grid polarizer of FIG. 3 are the same as, or equivalent to, their respective counterparts of FIG. 1, and thus, detailed descriptions thereof will be omitted.

Figure 4:
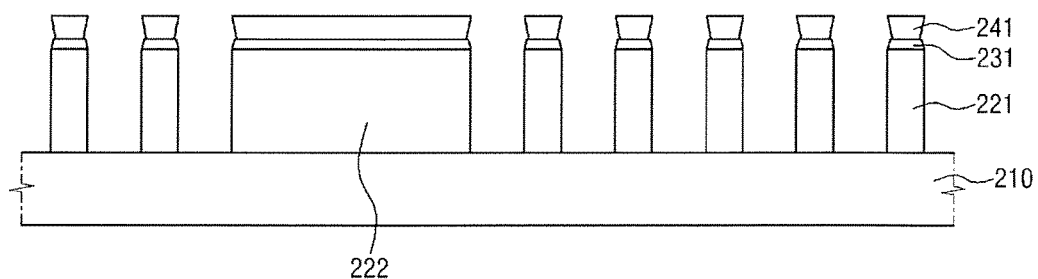
FIG. 4 is a vertical cross-sectional view of a wire grid polarizer according to another exemplary embodiment of the disclosure.

FIG. 4 is a vertical cross-sectional view of a wire grid polarizer according to another exemplary embodiment of the disclosure. Referring to FIG. 4 and further to FIG. 2, the wire grid polarizer includes a substrate 210, a plurality of conductive wire patterns 221, which are formed in parallel to protrude from a top surface of the substrate 210, a reflective layer 222 disposed among the conductive wire patterns 221 on the substrate 210, a plurality of first hard mask patterns 231 disposed on the conductive wire patterns 221 and on the reflective layer 222, and a plurality of second hard mask patterns 241 disposed on the first hard mask patterns 231.

The reflective layer 222 may correspond to an area that was not patterned into the conductive wire patterns 221, and may correspond to a non-aperture portion of a display device that includes the wire grid polarizer. For example, the reflective layer 222 may be formed in a wiring area or a transistor area, but embodiments of the disclosure are not limited thereto.

Other elements of the wire grid polarizer of FIG. 4 are the same as, or equivalent to, their respective counterparts of FIG. 1, and thus, detailed descriptions thereof will be omitted.

Figure 5:
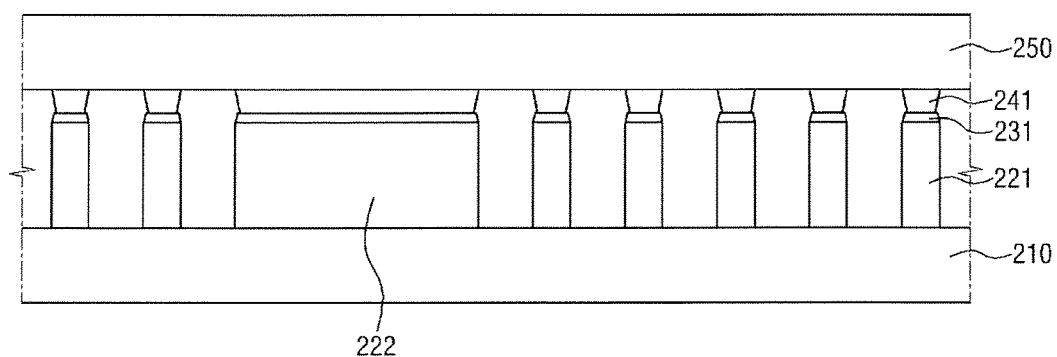
FIG. 5 is a vertical cross-sectional view of a wire grid polarizer according to another exemplary embodiment of the disclosure.

FIG. 5 is a vertical cross-sectional view of a wire grid polarizer according to another exemplary embodiment of the disclosure.

The wire grid polarizer shown in FIG. 5 has a structure similar to that of the wire grid polarizer of FIG. 4, except that it further includes a protective layer 250 spaced from the substrate 210 that overlaps an entire surface of the substrate 210 on which the plurality of conductive wire patterns 221 are formed.

Other elements of the wire grid polarizer of FIG. 5 are the same as, or equivalent to, their respective counterparts of FIG. 1, and thus, detailed descriptions thereof will be omitted.

FIGS. 6 to 13 are cross-sectional views illustrating a method of fabricating a wire grid polarizer, according to an exemplary embodiment of the disclosure.

Figure 6:
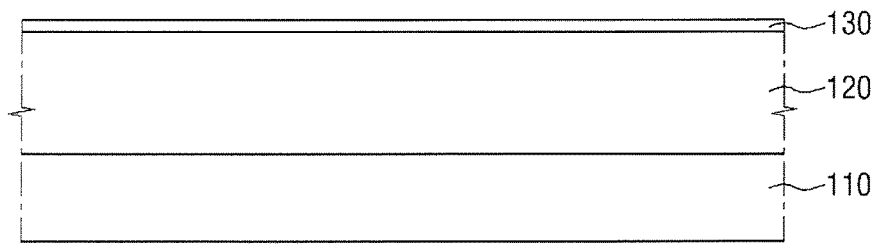
FIGS. 6 to 13 are cross-sectional views illustrating a method of fabricating a wire grid polarizer, according to an exemplary embodiment of the disclosure.

Referring to FIG. 6, a conductive wire pattern layer 120 and a first hard mask layer 130 are sequentially deposited on a substrate 110.

The material of the substrate 110 is transparent to visible light, and may otherwise be appropriately selected in consideration of the purpose of use of the substrate 110 and the type of processing that the substrate 110 is to be subjected. For example, the substrate 110 may be formed of various polymers such as glass, quartz, acrylic, TAC, a COP, a COC, PC, PET, or PES, but the disclosure is not limited thereto. The substrate 110 may also be formed of a flexible optical film material.

In addition, a buffer layer may be additionally formed between the substrate 110 and the conductive wire pattern layer 120.

The conductive wire pattern layer 120 and the first hard mask layer 130 may be formed by sputtering, chemical vapor deposition (CVD) or evaporation, but embodiments of the disclosure are not limited thereto.

The conductive wire pattern layer 120 may be formed of any conductive material. In an exemplary embodiment, the conductive wire pattern layer 120 may be formed of a metal. More specifically, the conductive wire pattern layer 120 may be formed of a metal selected from the group consisting essentially of Al, Cr, Ag, Cu, Ni, Ti, Co and Mo, or an alloy thereof, but embodiments of the disclosure are not limited thereto.

The conductive wire pattern layer 120 may include two or more layers. For example, the conductive wire pattern layer 120 may include a first conductive wire pattern layer, which is formed of Al, and a second conductive wire pattern layer, which is formed of Ti or Mo, but embodiments of the disclosure are not limited thereto. If the first conductive wire pattern layer is formed of Al, hillocks may be generated in a subsequent process at the top of the first conductive wire pattern layer, depending on the temperature. As a result, the top surface of a wire grid polarizer may become irregular, and optical properties of the wire grid polarizer may deteriorate. To address this situation, the second conductive wire pattern layer may be formed on the first conductive wire pattern layer using Ti or Mo to prevent the generation of hillocks.

The first hard mask pattern layer 130 may be formed of a polymer, an oxide or a nitride. For example, the first hard mask pattern layer 130 may be formed of SiOx, SiNx, SiOC or a mixture thereof, but embodiments of the disclosure are not limited thereto.

The thickness of the first hard mask pattern layer 130 may be in, but is not limited to, the range of about 10 nm to about 30 nm to prevent the taper angle of the first hard mask pattern layer 130 from becoming too small during etching.

Figure 7:
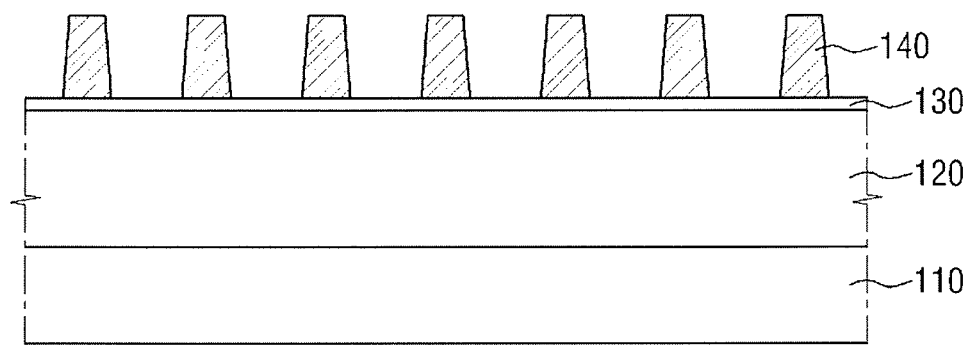

Referring to FIG. 7, resist patterns 140 are formed on the first hard mask pattern layer 130.

The resist patterns 140 may be formed of any resist material. For example, the resist patterns 140 may be formed of a material comprising hydrocarbon, but embodiments of the disclosure are not limited thereto.

The resist patterns 140 may be formed to have a taper angle of about 90 degrees or less. As a result, second hard mask patterns 141 may be formed among the resist patterns 140 to have a taper angle of about 90 degrees or greater.

Figure 8:
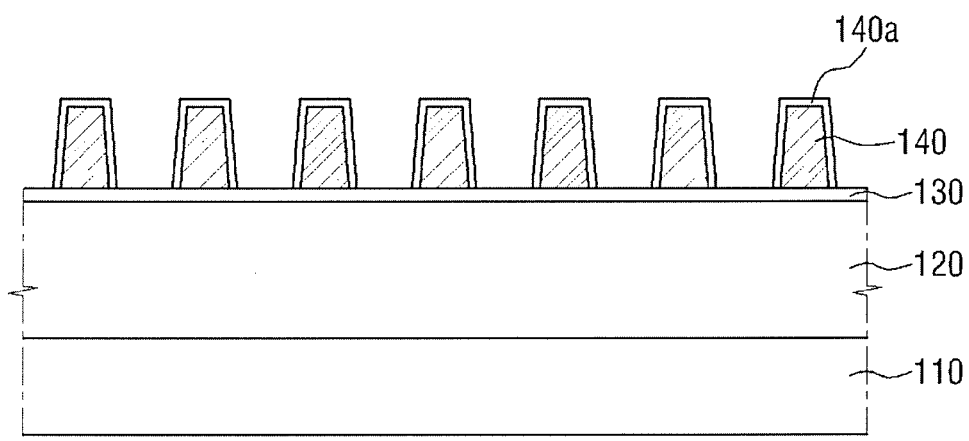

Referring to FIG. 8, hydrophobic surfaces 140a are formed by performing a selective hydrophobic treatment process on the surfaces of the resist patterns 140.

For example, the selective hydrophobic treatment process may be plasma treatment performed in a fluorine-based gas atmosphere. As a result of the plasma treatment performed in the fluorine-based gas atmosphere, C—F bonds are formed on the surfaces of hydrocarbon resist patterns 140, and the surfaces of the resist patterns 140 may become hydrophobic. The plasma treatment may be an $NF_3$ plasma treatment, but embodiments of the disclosure are not limited thereto.

No C—F bonds are formed on the surface of the first hard mask pattern layer 130, thus the surface of the first hard mask pattern layer 130 does not become hydrophobic.

Figure 9:
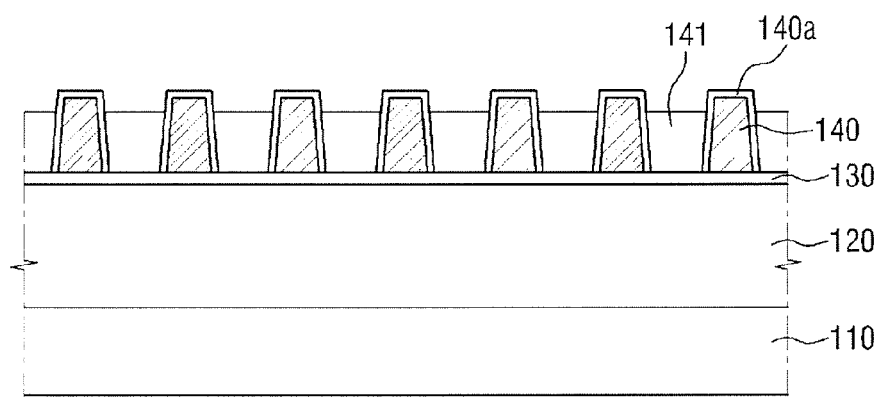

Referring to FIG. 9, the second hard mask patterns 141 are formed among the resist patterns 140 with the hydrophobic surfaces 140a.

The second hard mask patterns 141 may be formed of a transparent material, such as a polymer, an oxide or a nitride. For example, the second hard mask patterns 141 may be formed of $SiO_x$, $SiN_x$, $SiOC$ or a mixture thereof, but embodiments of the disclosure are not limited thereto. The second hard mask patterns 141 may be formed of the same material as the first hard mask pattern layer 130, but embodiments of the disclosure are not limited thereto.

The second hard mask patterns 141 are formed by, for example, deposition, not by etching, thus the formation of the second hard mask patterns 141 may be guided by the sides of each of the resist patterns 140. Since the resist patterns 141 have a taper angle of about 90 degrees or less, the second hard mask patterns 141 will have a taper angle of about 90 degrees or greater.

Figure 10:
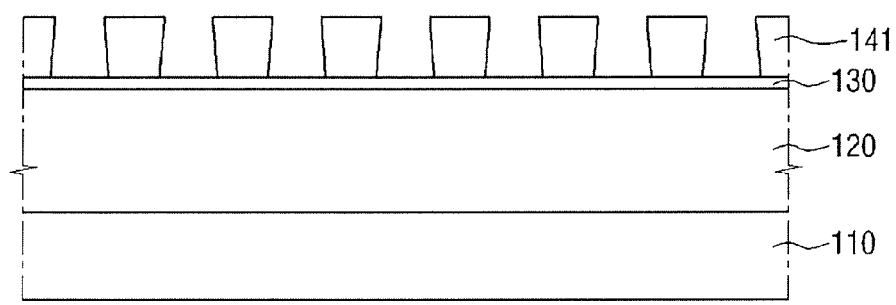

Referring to FIG. 10, the resist patterns 140 are removed so that the second hard mask patterns 141 remain on the first hard mask pattern layer 130.

The removal of the resist patterns 140 may be performed by rinsing, washing, ashing or etching, but embodiments of the disclosure are not limited thereto. That is, any method capable of selectively removing the resist patterns 140 while leaving the second hard mask patterns 141 on the first hard mask pattern layer 130 may be used.

Figure 11:
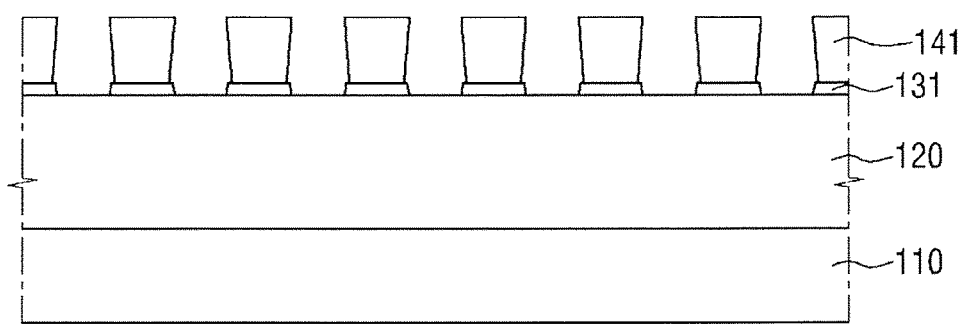

Referring to FIG. 11, first hard mask patterns 131 are formed by etching the first hard mask pattern layer 130 using the second hard mask patterns 141 as an etch mask. Since the first hard mask patterns 131 are formed by etching, the first hard mask patterns 131 may be more etched at the top than at the bottom thereof. Accordingly, the taper angle of the first hard mask patterns 131 may be about 90 degrees or less.

If the first hard mask patterns 131 are formed without the second hard mask patterns 141, the first hard mask patterns 131 may be thin, and the conductive wire patterns 121 may be damaged during the etching of the conductive wire pattern layer 120. To prevent this occurrence, the first hard mask patterns 131 may be formed thick. In this case, however, the taper angle of the first hard mask patterns 131 may be reduced during the etching of the conductive wire pattern layer 120, and as a result, the taper angle of the conductive wire patterns 121 may also be reduced, thereby deteriorating optical properties of a wire grid polarizer.

Since the second hard mask patterns 141 have a taper angle of about 90 degrees or greater, the top width of the second hard mask patterns 141 may be greater than the bottom width of the second hard mask patterns 141. In this case, if an anisotropic etching is performed to form the first hard mask patterns 131, the top width of the first hard mask patterns 131 may be greater than the bottom width of the second hard mask patterns 141.

Figure 12:
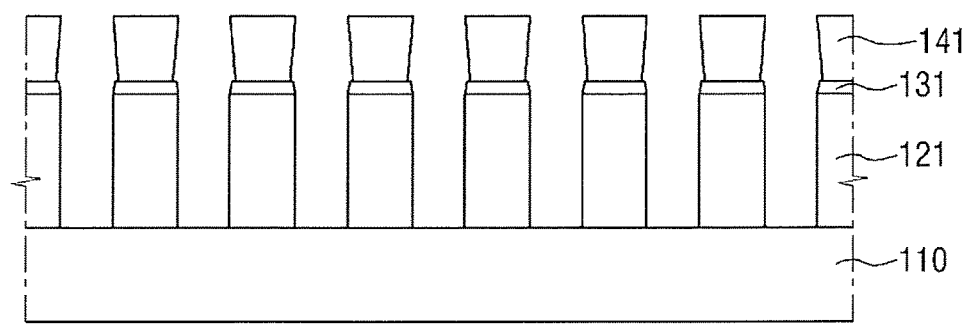

Referring to FIG. 12, the conductive wire patterns 121 are formed by patterning the conductive wire pattern layer 120 using the first hard mask patterns 131 and the second hard mask patterns 141 as etching masks.

The conductive wire patterns 121 may be formed in parallel with a predetermined period. If the period of the conductive wire patterns 121 is less than the wavelength of incident light, the polarization extinction ratio of a wire grid polarizer increases. However, the shorter the period, the more challenging it becomes to fabricate a wire grid polarizer. A visible light spectrum generally ranges from about 380 to about 780 nm. A wire grid polarizer should have a period of at least 200 nm or less to have a high extinction ratio for the three primary colors, i.e., red, green and blue, of light. Only then can polarization characteristics be expected. A wire grid polarizer may have, but is not limited to, a period of about 120 nm or less to exhibit polarization performance equal to or better than that of a related-art polarizer.

The width of the conductive wire patterns 121 may be in, but is not limited to, the range of about 10 nm to about 500 nm, or the range of about 10 nm to about 200 nm, as long as it is less than the period of the conductive wire patterns 121 and the conductive wire patterns 121 can exhibit polarization.

Figure 13:
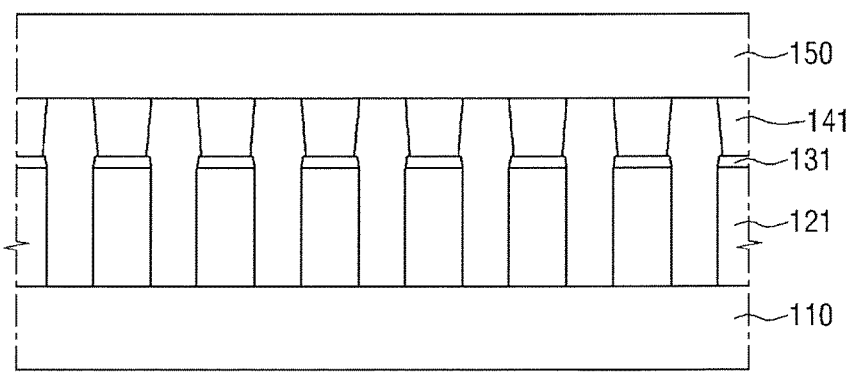
Figure 14:
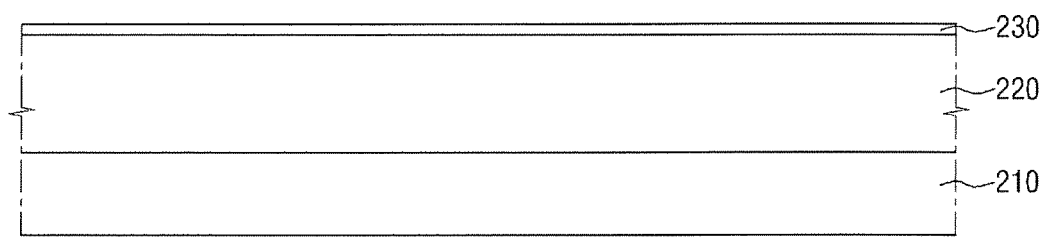
FIGS. 14 to 21 are cross-sectional views illustrating a method of fabricating a wire grid polarizer, according to another exemplary embodiment of the disclosure.

Referring to FIG. 13, after the formation of the conductive wire patterns 121, a protective layer 150 may be formed on the second hard mask patterns 141. The protective layer 150 may be spaced from the substrate 110 and overlap or cover an entire surface of the substrate 110.

The protective layer 150 may be formed of at least one selected from the group consisting essentially of, for example, $SiO_x$, $SiN_x$ and $SiOC$, but embodiments of the disclosure are not limited thereto. For example, the protective layer 150 may have a structure that includes a $SiO_x$ layer and a $SiOC$ layer deposited on the $SiO_x$ layer. In this example, the protective layer 150 can be deposited using the same chamber and the same conditions by changing raw material gases, and can be efficiently formed because the $SiOC$ layer can be relatively quickly deposited.

FIGS. 14 to 21 are cross-sectional views illustrating a method of fabricating a wire grid polarizer according to another exemplary embodiment of the disclosure.

Referring to FIGS. 14 to 21, a conductive wire pattern layer 220 and a first hard mask layer 230 are sequentially deposited on a substrate 210.

Figure 15:
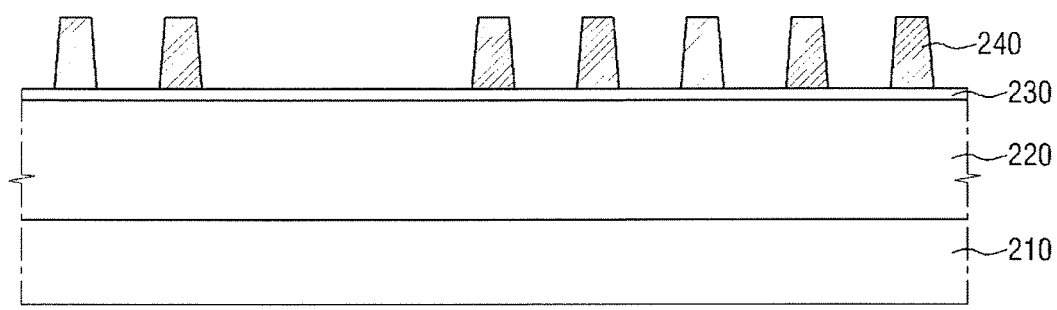

Resist patterns 240 are formed on the first hard mask layer 230. The resist patterns 240 may be formed in parallel on the entire surface of the first hard mask layer 230, but are not formed in some areas (FIG. 15).

Figure 16:
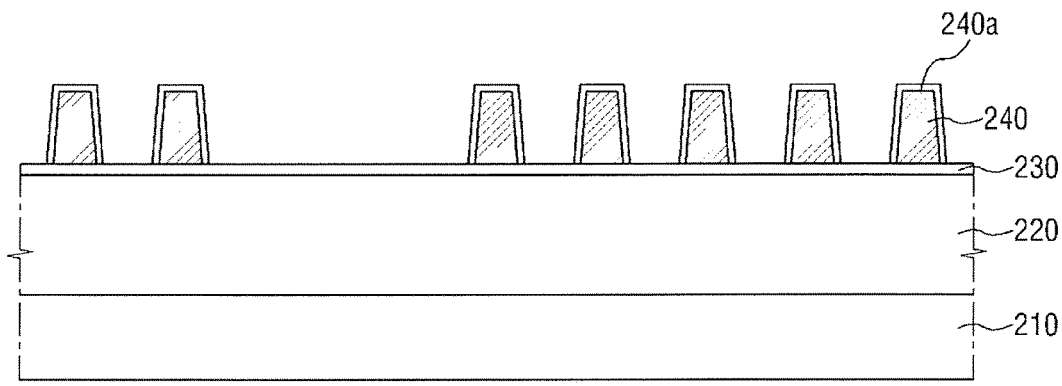

Thereafter, hydrophobic surfaces 240a are formed by performing a selective hydrophobic treatment process on the surfaces of the resist patterns 240 (FIG. 16).

Figure 17:
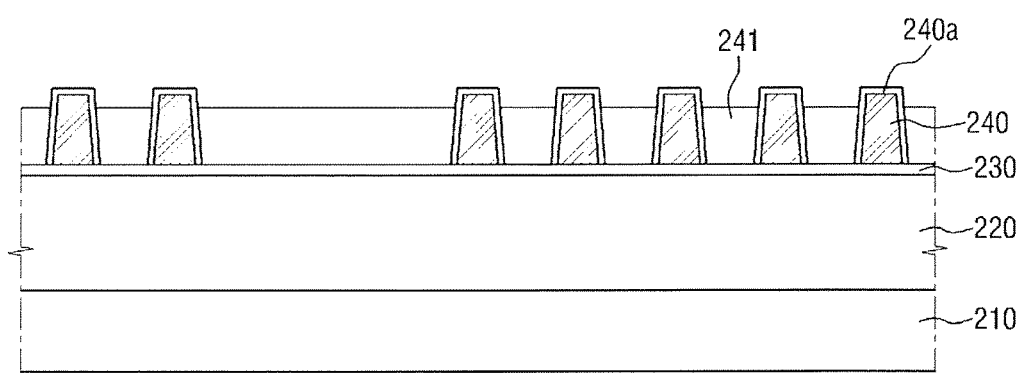

Second hard mask patterns 241 are formed among the resist patterns 240 with the hydrophobic surfaces 240a (FIG. 17).

Figure 18:
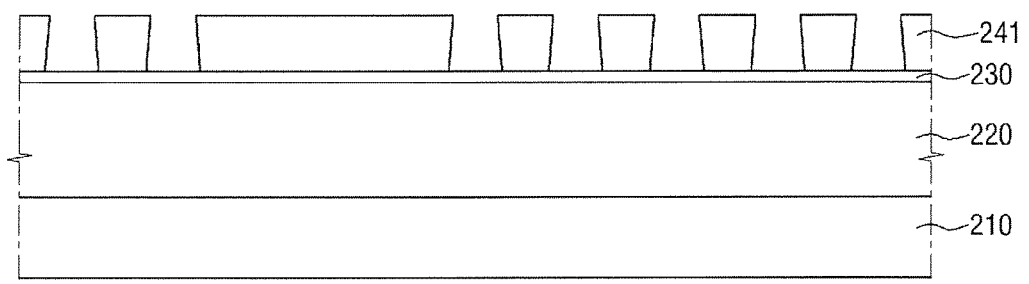

The resist patterns 240 are removed so that the second hard mask patterns 241 remain on the first hard mask pattern layer 230 (FIG. 18).

Figure 19:
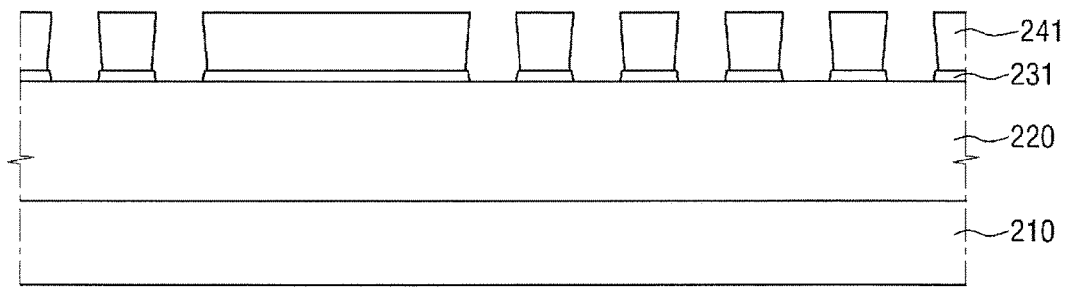

First hard mask patterns 231 are formed by etching the first hard mask pattern layer 230 using the second hard mask patterns 241 as an etching mask (FIG. 19).

Figure 20:
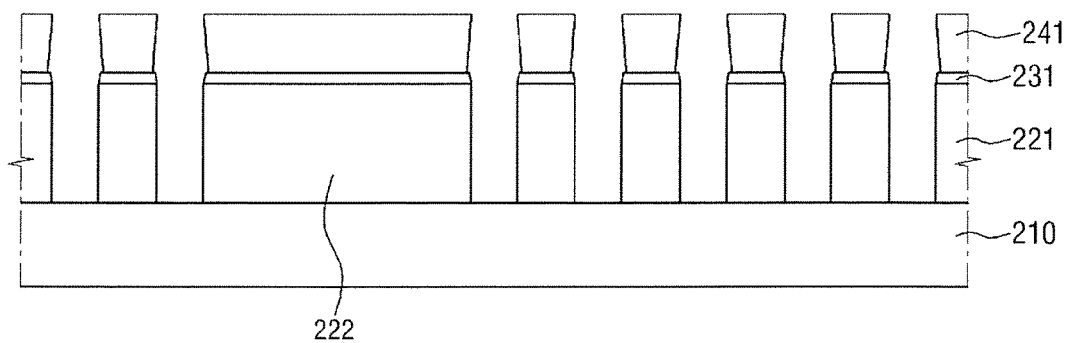

Conductive wire patterns 221 and a reflective layer 222 are formed by patterning the conductive wire pattern layer 220 using the first hard mask patterns 231 and the second hard mask patterns 241 as etching masks (FIG. 20).

The reflective layer 222 may correspond to a non-nano-patterned area between the conductive wire patterns 221. The width of the reflective layer 222 may be appropriately adjusted to fit the size of a non-aperture portion of a display device.

Figure 21:
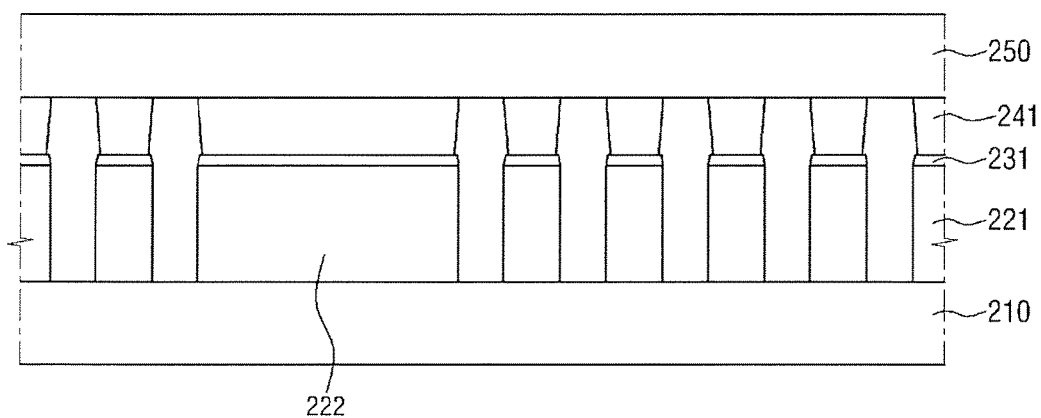

After the formation of the conductive wire patterns 221 and the reflective layer 222, a protective layer 250 may be formed that is spaced from the substrate 210 to overlap an entire surface of the substrate 210 where the conductive wire patterns 221 are formed (FIG. 21).

Other elements of the exemplary embodiment of FIGS. 14 to 21 are the same as, or at least equivalent to, their respective counterparts of the exemplary embodiment of FIGS. 6 to 13, and thus, detailed descriptions thereof will be omitted.

Figure 22:
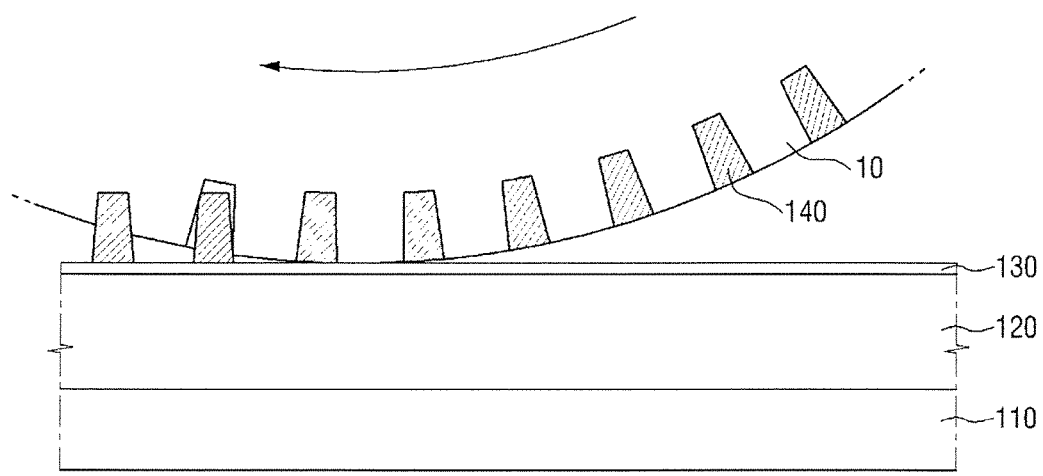
FIG. 22 is a cross-sectional view illustrating a method of fabricating a resist pattern, according to an exemplary embodiment of the disclosure.

FIG. 22 is a cross-sectional view illustrating a method of fabricating a resist pattern, according to an exemplary embodiment of the disclosure.

Referring to FIG. 22, a roll resist method may be used to form resist patterns 140 on a first hard mask pattern layer 130.

A roller 10 may include recessed patterns into which resist patterns 140 are respectively inserted. In response to the roller 10 being rolled over the first hard mask pattern layer 130, the resist patterns 140 are transferred from the roller 10 to the first hard mask pattern layer 130.

Figure 23:
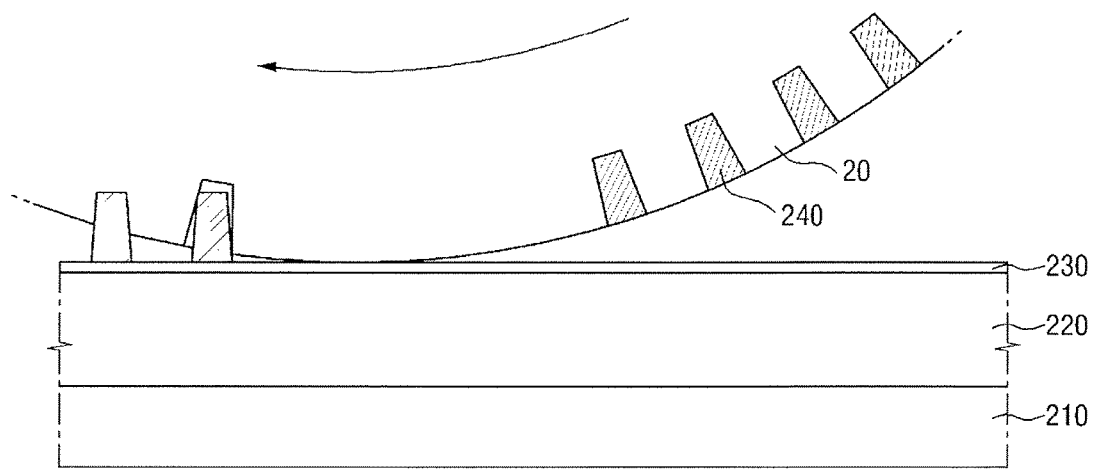
FIG. 23 is a cross-sectional view illustrating a method of fabricating a resist pattern, according to another exemplary embodiment of the disclosure.

FIG. 23 is a cross-sectional view illustrating a method of fabricating a resist pattern, according to another exemplary embodiment of the disclosure.

Referring to FIG. 23, a roll resist method may be used to form resist patterns 240 on a first hard mask pattern layer 230.

A roller 20 may include recessed patterns into which resist patterns 240 are respectively inserted, but may have no such recessed patterns in an area corresponding to part of a substrate 210 where a reflective layer 222 is to be formed. In response to the roller 20 being rolled over the first hard mask pattern layer 230, the resist patterns 240 are transferred from the roller 20 to the first hard mask pattern layer 230.

However, the effects of the present disclosure are not restricted to the one set forth herein. The above and other effects of the present disclosure will become more apparent to one of daily skill in the art to which the present disclosure pertains by referencing the claims.

What is claimed is:

1. A wire grid polarizer, comprising:
a substrate;
a plurality of conductive wire patterns formed in parallel that protrude from a top surface of the substrate;
first hard mask patterns disposed on the conductive wire patterns; and
second hard mask patterns disposed on the first hard mask patterns,
wherein a ratio of a taper angle of the second hard mask patterns to a taper angle of the first hard mask pattern is greater than 1.

2. The wire grid polarizer of claim 1, wherein the taper angle of the first hard mask patterns is less than 90 degrees.

3. The wire grid polarizer of claim 1, wherein the taper angle of the second hard mask patterns is greater than 90 degrees.

4. The wire grid polarizer of claim 1, wherein a ratio of a bottom width of the second hard mask patterns to a top width of the first hard mask patterns is less than 1.

5. The wire grid polarizer of claim 1, wherein a thickness of the first hard mask patterns is in a range of about 10 nm to about 30 nm.

6. The wire grid polarizer of claim 1, further comprising:
a protective layer disposed spaced from the substrate that overlaps an entire surface of the substrate where the conductive wire patterns are formed.

7. The wire grid polarizer of claim 1, further comprising:
reflective layers disposed on the substrate among the conductive wire patterns;
wherein first hard mask patterns are disposed on the reflective layers.

8. A wire grid polarizer, comprising:
a substrate;
a plurality of conductive wire patterns formed in parallel that protrude from a top surface of the substrate;
first hard mask patterns disposed on the conductive wire patterns; and
second hard mask patterns disposed on the first hard mask patterns,
wherein a ratio of a bottom width of the second hard mask patterns to a top width of the first hard mask patterns is less than 1.

9. The wire grid polarizer of claim 8, wherein a ratio of a taper angle of the second hard mask patterns to a taper angle of the first hard mask pattern is greater than 1 and the taper angle of the first hard mask patterns is less than 90 degrees.

10. The wire grid polarizer of claim 8, wherein a ratio of a taper angle of the second hard mask patterns to a taper angle of the first hard mask pattern is greater than 1 and the taper angle of the second hard mask patterns is less than 90 degrees.

11. The wire grid polarizer of claim 8, wherein the taper angle of the first hard mask patterns is less than 90 degrees.

12. The wire grid polarizer of claim 8, wherein the taper angle of the second hard mask patterns is greater than 90 degrees.

13. The wire grid polarizer of claim 8, wherein a thickness of the first hard mask patterns is in a range of about 10 nm to about 30 nm.

14. The wire grid polarizer of claim 8, further comprising:
a protective layer disposed spaced from the substrate that overlaps an entire surface of the substrate where the conductive wire patterns are formed.

15. The wire grid polarizer of claim 8, further comprising:
reflective layers disposed on the substrate among the conductive, wire patterns,
wherein first hard mask patterns are disposed on the reflective layers.

* * * * *